(12) United States Patent
Lee et al.

(10) Patent No.: US 10,283,713 B2
(45) Date of Patent: May 7, 2019

(54) METHOD OF MANUFACTURING DISPLAY DEVICE USING DEPOSITION MASK ASSEMBLY

(71) Applicant: SAMSUNG DISPLAY CO., LTD., Yongin-si, Gyeonggi-do (KR)

(72) Inventors: Su Hwan Lee, Yongin-si (KR); Eun Ho Kim, Yongin-si (KR)

(73) Assignee: Samsung Display Co., Ltd., Yongin-Si, Gyeonggi-do (KR)

(*) Notice: Subject to any disclaimer, the term of this patent is extended or adjusted under 35 U.S.C. 154(b) by 0 days.

(21) Appl. No.: 16/176,012

(22) Filed: Oct. 31, 2018

(65) Prior Publication Data

US 2019/0067584 A1    Feb. 28, 2019

Related U.S. Application Data

(62) Division of application No. 15/175,282, filed on Jun. 7, 2016, now Pat. No. 10,128,440.

(30) Foreign Application Priority Data

Nov. 2, 2015    (KR) .................... 10-2015-0153076

(51) Int. Cl.
    *C23C 14/00*    (2006.01)
    *H01L 51/00*    (2006.01)
    *H01L 51/52*    (2006.01)
    *H01L 51/56*    (2006.01)

(52) U.S. Cl.
    CPC .......... *H01L 51/0012* (2013.01); *C23C 14/00* (2013.01); *H01L 51/0011* (2013.01); *H01L 51/5237* (2013.01); *H01L 51/56* (2013.01)

(58) Field of Classification Search
    None
    See application file for complete search history.

(56) References Cited

U.S. PATENT DOCUMENTS

| | | |
|---|---|---|
| 6,858,086 B2 | 2/2005 | Kang |
| 7,268,406 B2 | 9/2007 | Yotsuya |
| 7,909,932 B2 | 3/2011 | Koeda |
| 7,987,812 B2 | 8/2011 | Kim |
| 8,151,729 B2 | 4/2012 | Ko |
| 8,286,579 B2 | 10/2012 | Sung |
| 8,343,278 B2 | 1/2013 | Sung |
| 8,402,917 B2 | 3/2013 | Ko |
| 8,550,032 B2 | 10/2013 | Park |

(Continued)

FOREIGN PATENT DOCUMENTS

| | | |
|---|---|---|
| JP | 2007157662 A | 6/2007 |
| JP | 2007188728 A | 7/2007 |

(Continued)

*Primary Examiner* — David E Graybill
(74) *Attorney, Agent, or Firm* — Lee & Morse, P.C.

(57) ABSTRACT

A deposition mask assembly includes a frame including a first opening portion and a second opening portion spaced apart from each other in a first direction, a first split mask group including a plurality of first split masks arranged on the first opening portion in a second direction crossing the first direction, and a second split mask group including a plurality of second split masks arranged on the second opening portion in the second direction, wherein a boundary between adjacent first split masks in the second direction and a boundary between adjacent second split masks in the second direction are at different positions.

11 Claims, 11 Drawing Sheets

(56) References Cited

U.S. PATENT DOCUMENTS

| | | |
|---|---|---|
| 8,631,761 B2 | 1/2014 | Kang |
| 8,646,406 B2 | 2/2014 | Ahn |
| 8,701,592 B2 | 4/2014 | Ko |
| 8,757,088 B2 | 6/2014 | Lee |
| 8,852,346 B2 | 10/2014 | Lee |
| 8,869,738 B2 | 10/2014 | Shin |
| 8,915,212 B2 | 12/2014 | Lee |
| 8,915,213 B2 | 12/2014 | Park |
| 8,925,480 B2 | 1/2015 | Kim |
| 8,951,699 B2 | 2/2015 | Chiang |
| 9,141,001 B2 | 9/2015 | Kim |
| 9,187,817 B2 | 11/2015 | Kim |
| 9,238,276 B2 | 1/2016 | Kang |
| 9,240,572 B2 | 1/2016 | Kawato |
| 9,259,805 B2 | 2/2016 | Kim |
| 9,284,638 B2 | 3/2016 | Ko |
| 9,321,074 B2 | 4/2016 | Ko |
| 9,346,078 B2 | 5/2016 | Oh |
| 9,365,923 B2 | 6/2016 | Ochi |
| 9,441,288 B2 | 9/2016 | Sung |
| 9,530,961 B2 | 12/2016 | Yi |
| 9,567,662 B2 | 2/2017 | Kim |
| 9,583,708 B2 | 2/2017 | Ko |
| 2003/0101932 A1 | 6/2003 | Kang |
| 2003/0221614 A1 | 12/2003 | Kang |
| 2004/0020435 A1 | 2/2004 | Tsuchiya |
| 2006/0012290 A1 | 1/2006 | Kang |
| 2006/0103289 A1 | 5/2006 | Kim |
| 2006/0258030 A1 | 11/2006 | Koeda |
| 2007/0017895 A1 | 1/2007 | Yotsuya |
| 2007/0018265 A1 | 1/2007 | Koeda |
| 2009/0137180 A1 | 5/2009 | Sung |
| 2009/0297768 A1 | 12/2009 | Ko |
| 2010/0055810 A1 | 3/2010 | Sung |
| 2010/0192856 A1 | 8/2010 | Sung |
| 2010/0267227 A1 | 10/2010 | Ko |
| 2011/0053300 A1 | 3/2011 | Ryu |
| 2011/0067630 A1 | 3/2011 | Ko |
| 2011/0139069 A1 | 6/2011 | Ahn |
| 2011/0139365 A1 | 6/2011 | Kim |
| 2011/0146573 A1 | 6/2011 | Park |
| 2011/0168087 A1 | 7/2011 | Lee |
| 2011/0171768 A1 | 7/2011 | Hong |
| 2011/0179996 A1 | 7/2011 | Park |
| 2011/0185965 A1 | 8/2011 | Park |
| 2011/0185966 A1 | 8/2011 | Lee, II |
| 2011/0220019 A1 | 9/2011 | Lee |
| 2011/0229633 A1 | 9/2011 | Hong |
| 2011/0265714 A1 | 11/2011 | Lee |
| 2012/0145076 A1 | 6/2012 | Shin |
| 2012/0156812 A1 | 6/2012 | Ko |
| 2012/0174862 A1 | 7/2012 | Lee |
| 2012/0174863 A1 | 7/2012 | Park |
| 2012/0234235 A1 | 9/2012 | Lee |
| 2012/0266813 A1 | 10/2012 | Hong |
| 2012/0279444 A1 | 11/2012 | Hong |
| 2012/0279445 A1 | 11/2012 | Kim |
| 2012/0282445 A1 | 11/2012 | Kim |
| 2012/0325143 A1 | 12/2012 | Kang |
| 2013/0003033 A1 | 1/2013 | Lee |
| 2013/0059063 A1 | 3/2013 | Kawato |
| 2013/0071775 A1 | 3/2013 | Prushinskiy |
| 2013/0133573 A1 | 5/2013 | Joo |
| 2013/0134451 A1 | 5/2013 | Lee |
| 2013/0298826 A1 | 11/2013 | Park |
| 2013/0314686 A1 | 11/2013 | Kim |
| 2013/0334515 A1 | 12/2013 | Lee |
| 2013/0337597 A1 | 12/2013 | Kawato |
| 2014/0000792 A1 | 1/2014 | Ko |
| 2014/0033975 A1 | 2/2014 | Oh |
| 2014/0065355 A1 | 3/2014 | Kang |
| 2014/0120796 A1 | 5/2014 | Kim |
| 2014/0130735 A1 | 5/2014 | Kim |
| 2014/0137798 A1 | 5/2014 | Ahn |
| 2014/0147949 A1 | 5/2014 | Hong |
| 2014/0150721 A1 | 6/2014 | Oh |
| 2014/0158045 A1 | 6/2014 | Lee |
| 2014/0230219 A1 | 8/2014 | Lee |
| 2014/0239049 A1 | 8/2014 | Kang |
| 2014/0312318 A1 | 10/2014 | Choi |
| 2014/0331926 A1 | 11/2014 | Kim |
| 2014/0335688 A1 | 11/2014 | Ko |
| 2014/0356769 A1 | 12/2014 | Prushinskiy |
| 2015/0007767 A1 | 1/2015 | Ko |
| 2015/0007768 A1 | 1/2015 | Lee |
| 2015/0034005 A1 | 2/2015 | Ko |
| 2015/0047560 A1 | 2/2015 | Kang |
| 2015/0101536 A1 | 4/2015 | Han |
| 2015/0102329 A1 | 4/2015 | Lee |
| 2015/0114287 A1 | 4/2015 | Kim |
| 2015/0165464 A1 | 6/2015 | Baek |
| 2016/0005970 A1 | 1/2016 | Kwen |
| 2016/0079532 A1 | 3/2016 | Yi |
| 2016/0122860 A1 | 5/2016 | Kim |
| 2016/0126507 A1 | 5/2016 | Ko |
| 2016/0208392 A1 | 7/2016 | Ikenaga |
| 2016/0369392 A1 | 12/2016 | Kim |
| 2017/0012201 A1 | 1/2017 | Ochi |
| 2017/0081758 A1 | 3/2017 | Inoue |

FOREIGN PATENT DOCUMENTS

| | | |
|---|---|---|
| JP | 2009068872 A | 4/2009 |
| JP | 2011117028 A | 6/2011 |
| JP | 2012233253 A | 11/2012 |

METHOD OF MANUFACTURING DISPLAY DEVICE USING DEPOSITION MASK ASSEMBLY

CROSS-REFERENCE TO RELATED APPLICATIONS

This is a divisional application based on pending application Ser. No. 15/175,282, filed Jun. 7, 2016, the entire contents of which is hereby incorporated by reference.

Korean Patent Application No. 10-2015-0153076, filed on Nov. 2, 2015, in the Korean Intellectual Property Office, and entitled: "Deposition Mask Assembly and Method of Manufacturing Display Device Using the Same," is incorporated by reference herein in its entirety.

BACKGROUND

1. Field

The present disclosure relates to a deposition mask assembly and a method of manufacturing a display device using the same.

2. Description of the Related Art

Among light-emitting display devices, an organic light-emitting display device, which is a self-luminescent display device, has advantages of a wide viewing angle, high contrast, and rapid response speed. Therefore, the organic light-emitting display device has attracted considerable attention as a next-generation display device.

The organic light-emitting display device is provided with a light-emitting layer made of an organic luminescent material between an anode electrode and a cathode electrode. When positive and negative voltages are respectively applied to these electrodes, holes discharged from the anode electrode are transferred to the light-emitting layer through a hole injection layer and a hole transport layer, electrons discharged from the cathode electrode are transferred to the light-emitting layer through an electron injection layer and an electron transport layer, and the electrons and holes are recombined in the light-emitting layer, so as to generate excitons. When these excitons are changed from an excited state to a ground state, light is emitted from the light-emitting layer, thereby displaying an image.

The organic light-emitting display device includes a pixel defining film having an opening portion for exposing an anode electrode formed for each pixel. A hole injection layer, a hole transport layer, a light-emitting layer, an electron transport layer, an electron injection layer, and a cathode electrode are sequentially formed on the anode electrode exposed through the opening portion of the pixel defining film. Among these, the hole injection layer, the hole transport layer, the light-emitting layer, the electron transport layer, and the electron injection layer may be formed by various methods. One of the various methods is a deposition method. For example, in the deposition method, a small mask scanning (SMS) deposition method may be used, i.e., a substrate or a deposition source may be moved, while the substrate is spaced apart from a mask having a smaller size than the substrate.

SUMMARY

Aspects of the present disclosure provide a deposition mask assembly, which can reduce the occurrence of a distortion of a pattern of a thin film at the time of forming a thin film on a large substrate.

Aspects of the present disclosure also provide a method of manufacturing a display device using a deposition mask assembly that can reduce the occurrence of a distortion of the pattern of a thin film at the time of forming a thin film on a large substrate.

In one aspect of the present disclosure, there is provided a deposition mask assembly includes a frame including a first opening portion and a second opening portion spaced apart from each other in a first direction, a first split mask group including a plurality of first split masks arranged on the first opening portion in a second direction crossing the first direction, and a second split mask group including a plurality of second split masks arranged on the second opening portion in the second direction, wherein a boundary between adjacent first split masks in the second direction and a boundary between adjacent second split masks in the second direction are at different positions.

The outermost edges of the first split masks disposed at the outermost sides of the first split mask group and the outermost edges of the second split masks disposed at the outermost sides of the second split mask group may be located at the same positions in the second direction. the first split mask disposed at the outermost side of the first split mask group and the second split mask disposed at the outermost side of the second split mask group may have different widths from each other in the second direction, and may face each other in the first direction.

Each of the first split masks disposed at the outermost sides of the first split mask group may have a first width in the second direction, each of the first split masks, other than the first split masks disposed at the outermost sides of the first split mask group, may have a second width larger than the first width in the second direction, and each of the second split masks of the second split mask group may have a third width equal to the second width.

Each of the second split masks disposed at the outermost sides of the second split mask group may have a first width in the second direction, each of the second split masks, other than the second split masks disposed at the outermost sides of the second split mask group, may have a second width larger than the first width in the second direction, and each of the first split masks of the first split mask group may have a third width equal to the second width.

The first split mask located at one side of the first split masks disposed at the outermost sides of the first split mask group and the second split mask located at the other side of the second split masks disposed at the outermost sides of the second split mask group may have a first width in the second direction, and each of the first split masks, other than the first split mask located at one side of the first split masks disposed at the outermost sides of the first split mask group, may have a second width larger than the first width in the second direction, and each of the second split masks, other than the second split mask located at the other side of the second split masks disposed at the outermost sides of the second split mask group, may have the second width in the second direction.

Each of the first split masks may include welded portions formed at both edges thereof in the first direction, each of the second split masks may include welded portions formed at both edges thereof in the first direction.

The frame may include a reinforcing support defining the first opening portion and the second opening portion and extending in the second direction, and the welded portion of the first split mask and the welded portion of the second split mask face each other on the reinforcing support.

In another aspect of the present disclosure, there is provided a method of manufacturing a display device comprising: disposing a deposition mask assembly on a deposition source, in which the deposition mask assembly includes a frame including a first opening portion and a second opening part spaced apart from each other in a first direction, a first split mask group including a plurality of first split masks arranged on the first opening portion in a second direction crossing the first direction, and a second split mask group including a plurality of second split masks arranged on the second opening portion in the second direction, and is configured such that a boundary between the adjacent first split masks in the second direction and a boundary between the adjacent second split masks in the second direction are located at different positions; and moving a substrate over the deposition mask assembly in the first direction and discharging a deposition material toward the substrate sequentially passing through the first split mask group and the second split mask group using the deposition source to form a pattern layer on a portion of the substrate, the portion passing through the first split mask group and the second split mask group.

The pattern layer may include at least one of a hole transport layer and a light-emitting layer in a light-emitting display device.

The deposition mask assembly may be disposed to be spaced apart from the substrate.

The deposition mask assembly may have a shorter length than the substrate in the first direction.

The outermost edges of the first split masks disposed at the outermost sides of the first split mask group and the outermost edges of the second split masks disposed at the outermost sides of the second split mask group may be located at the same positions in the second direction.

The first split mask disposed at the outermost side of the first split mask group and the second split mask disposed at the outermost side of the second split mask group may have different widths from each other in the second direction, and may face each other in the first direction.

Each of the first split masks disposed at the outermost sides of the first split mask group may have a first width in the second direction, each of the first split masks, other than the first split masks disposed at the outermost sides of the first split mask group, may have a second width larger than the first width in the second direction, and each of the second split masks of the second split mask group may have a third width equal to the second width.

Each of the second split masks disposed at the outermost sides of the second split mask group may have a first width in the second direction, each of the second split masks, other than the second split masks disposed at the outermost sides of the second split mask group, may have a second width larger than the first width in the second direction, and each of the first split masks of the first split mask group may have a third width equal to the second width.

The first split mask located at one side of the first split masks disposed at the outermost sides of the first split mask group and the second split mask located at the other side of the second split masks disposed at the outermost sides of the second split mask group may have a first width in the second direction, and each of the first split masks, other than the first split mask located at the outermost sides of the first split mask group, may have a second width larger than the first width in the second direction, and each of the second split masks, other than the second split mask located at the other side of the second split masks disposed at the outermost sides of the second split mask group, may have the second width in the second direction.

Each of the first split masks may include welded portions formed at both edges thereof in the first direction, each of the second split masks may include welded portions formed at both edges thereof in the first direction.

The frame may include a reinforcing support defining the first opening portion and the second opening portion and extending in the second direction, and the welded portion of the first split mask and the welded portion of the second split mask may face each other on the reinforcing support.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
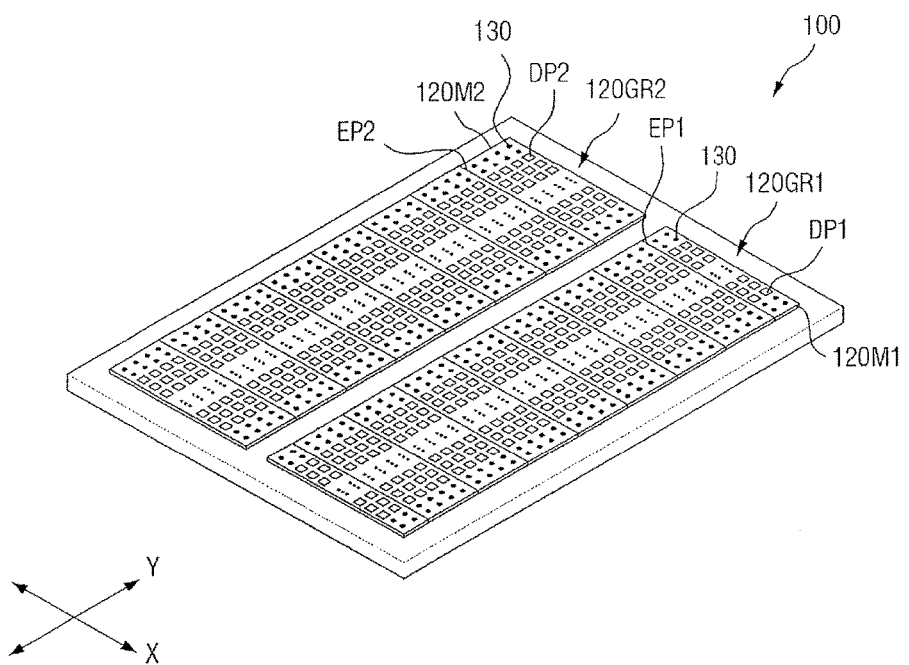
FIG. 1 illustrates a perspective view of a deposition mask assembly according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Hereinafter, preferred embodiments of the present disclosure will be described in detail with reference to the attached drawings.

Figure 2:
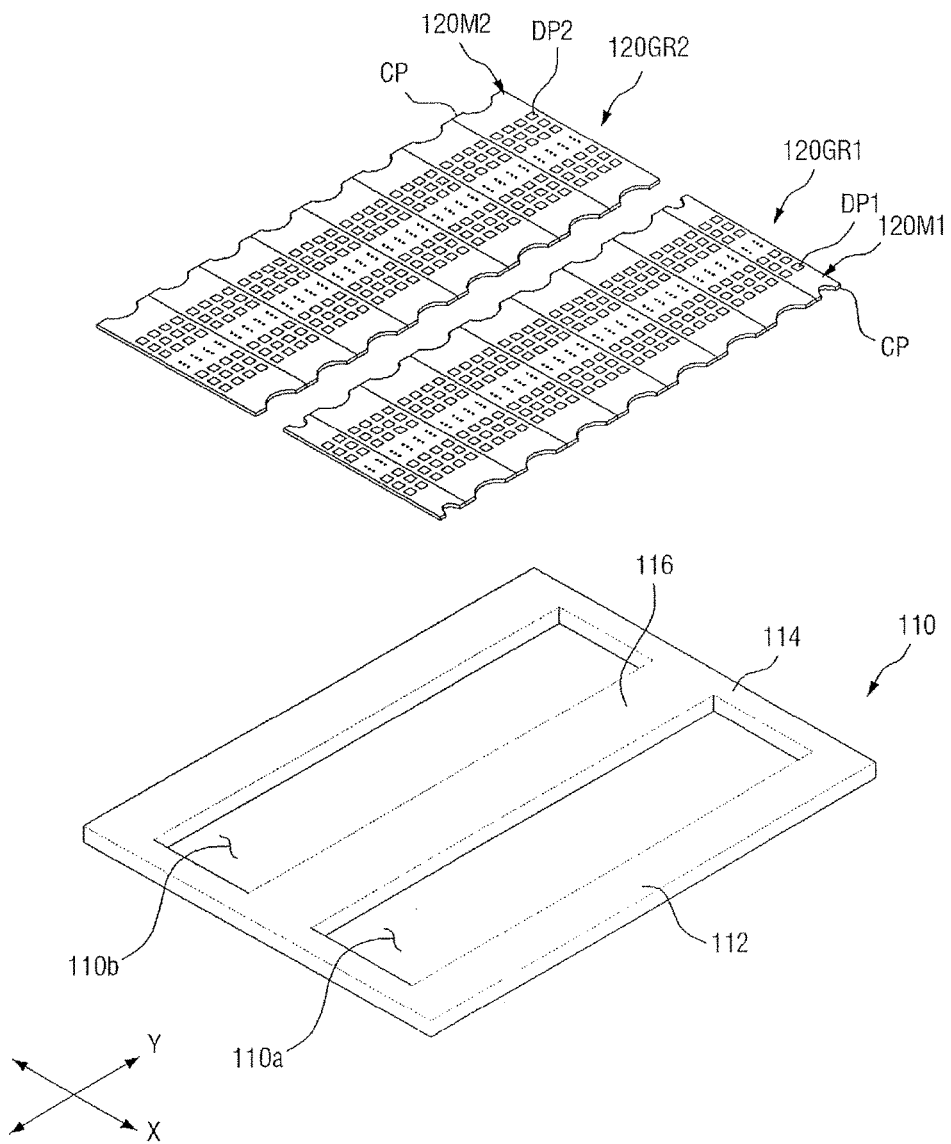
FIG. 2 illustrates a perspective exploded view of a frame and a plurality of split masks, which are provided in the deposition mask assembly of FIG. 1.

FIG. 1 is a perspective view of a deposition mask assembly according to an embodiment of the present disclosure, and FIG. 2 is a perspective view of a frame and a plurality of split masks, which are provided to form the deposition mask assembly of FIG. 1.

Referring to FIGS. 1 and 2, a deposition mask assembly 100 according to an embodiment of the present disclosure may include a frame 110 with a plurality of split mask groups. For example, the deposition mask assembly 100 may include a first split mask group 120GR1 and a second split mask group 120GR2 on the frame 110.

The frame 110 fixes and supports first split masks 120M1 of the first split mask group 120GR1 and second split masks 120M2 of the second split mask group 120GR2. The frame 110 may include at least two opening portions 110a and 110b spaced apart from each other in a first direction, i.e., along the X direction, to allow a deposition material to pass through the opening portions 110a and 110b at the time of depositing the deposition material on a substrate (500 of FIG. 5).

The frame 110 may include first supports 112 and second supports 114 so as to fix and support the first split masks 120M1 of the first split mask group 120GR1 and the second split masks 120M2 of the second split mask group 120GR2. The frame 110 may further include a reinforcing support 116 defining the at least two opening portions 110a and 110b.

The first supports 112 are parallel to each other, and are provided with the at least two opening portions 110a and 110b therebetween. That is, each of the first supports 112 extends in a second direction (Y) crossing the first direction (X), and these first supports 112 are spaced apart from each other in the first direction (X).

The second supports 114 are parallel to each other, and connected with the first supports 112. That is, each of the second supports 114 extends in the first direction (X), and these second supports 114 are spaced apart from each other in the second direction (Y).

The reinforcing support 116 is disposed between the first supports 112 in parallel to the first supports 112 so as to define the at least two opening portions 110a and 110b, and is connected with the second supports 114. This reinforcing support 116 serves to reduce the warpage of the frame 110. Further, the reinforcing support 116 can provide a space for fixing and supporting the first split masks 120M1 of the first split mask group 120GR1 and the second split masks 120M2 of the second split mask group 120GR2 together with the first supports 112 and the second supports 114.

In an embodiment of the present disclosure, the at least two opening portions 110a and 110b are exemplified as a first opening portion 110a and a second opening portion 110b, and one reinforcing support 116 is provided to define the first opening portion 110a and the second opening portion 110b. However, the number of opening portions and reinforcing supports may be adjusted. Further, although it is shown in FIG. 2 that the reinforcing support 116 is disposed at the center of the frame 110 in the first direction (X), the position of the reinforcing support 116 may be changed depending on the size of a thin film formed by the deposition method using the deposition mask assembly 100 in the display device or the size of the display device.

The first split masks 120M1 of the first split mask group 120GR1 and the second split masks 120M2 of the second split mask group 120GR2, to which tensile force is applied, are fixed on the frame 110 by welding. In this case, since the first split masks 120M1 of the first split mask group 120GR1 and the second split masks 120M2 of the second split mask group 120GR2 are bound to the frame 110 in a state where tensile force is applied, the tensile force may also be applied to the frame 110. Therefore, the frame 110 may be made of a metal material having high strength, e.g., stainless steel.

The first split mask group 120GR1 includes the plurality of first split masks 120M1 arranged on the first opening portion 110a of the frame 110 in the second direction (Y). Each of the first split masks 120M1 is a band-shaped split mask extending in the first direction (X), and has predetermined length and width. Each of the first split masks 120M1 includes deposition openings DP1. Each of the deposition openings DP1 may be formed to have a shape corresponding to the shape of a thin film formed by depositing a deposition material on a substrate (500 of FIG. 5). Therefore, in the deposition process, the deposition material is deposited on the substrate (500 of FIG. 5) through the deposition openings DP1, so as to form a thin film having a desired shape (for example, light-emitting layer).

As illustrated in FIG. 1, each of the first split masks 120M1 includes welded portions 130 formed at both edges thereof in the first direction (X). In order to dispose the deposition openings DP1 of each of the first split masks 120M1 and fix each of the first split masks 120M1, the welded portions 130 are formed by welding one edge of each of the first split masks 120M1 and the other edge thereof on the second support 114 and the reinforcing support 116, which are adjacent to the first opening portion 110a, using spot welding or laser welding.

Meanwhile, before fixing each of the first split masks 120M1 on the frame, as shown in FIG. 2, clamping portions CP protruding in the first direction (X) may be formed at both ends of each of the first split masks 120M1 in order to connect with clamps (not shown) applying tensile force in the first direction (X). These clamping portions CP may be cut and removed after fixing each of the first split masks 120M1 on the frame.

The second split mask group 120GR2 includes the plurality of second split masks 120M2 arranged on the second opening portion 110b of the frame 110 in the second direction (Y). Each of the second split masks 120M2 is a band-shaped split mask extending in the first direction (X), and has predetermined length and width. Each of the second split masks 120M2 includes deposition openings DP2. Each of the deposition openings DP2 may be formed to have a shape corresponding to the shape of a thin film formed by depositing a deposition material on a substrate (500 of FIG. 5). Therefore, in the deposition process, the deposition material is deposited on the substrate (500 of FIG. 5) through the deposition openings DP2, so as to form a thin film having a desired shape (for example, light-emitting layer).

As described above, a thin film, e.g., a light-emitting layer, may be formed on the substrate 500 by performing deposition using the first split masks 120M1 and the second split masks 120M2 two times. As such, due to the relatively small size of the split masks 120M1 and 120M2 used in forming the thin film, e.g., the split masks 120M1 and 120M2 are substantially smaller than the substrate 500, the sagging of split masks can be reduced, e.g., compared to when a deposition process is performed using large split masks.

As described previously with respect to the first split masks 120M1, each of the second split masks 120M2 includes welded portions 130 formed at both edges thereof in the first direction (X). In order to dispose the deposition openings DP2 of each of the second split masks 120M2 and fix each of the second split masks 120M2, the welded portions 130 are formed by welding one edge of each of the second split masks 120M1 and the other edge thereof on the second support 114 and the reinforcing support 116, which are adjacent to the second opening portion 110b, using spot welding or laser welding. Before fixing each of the second split masks 120M2 on the frame, as shown in FIG. 2, clamping portions CL protruding in the first direction (X) may be formed at both ends of each of the second split masks 120M2 in order to connect with clamps (not shown) applying tensile force in the first direction (X). These clamping portions CL may be cut and removed after fixing each of the second split masks 120M2 on the frame.

Figure 3:
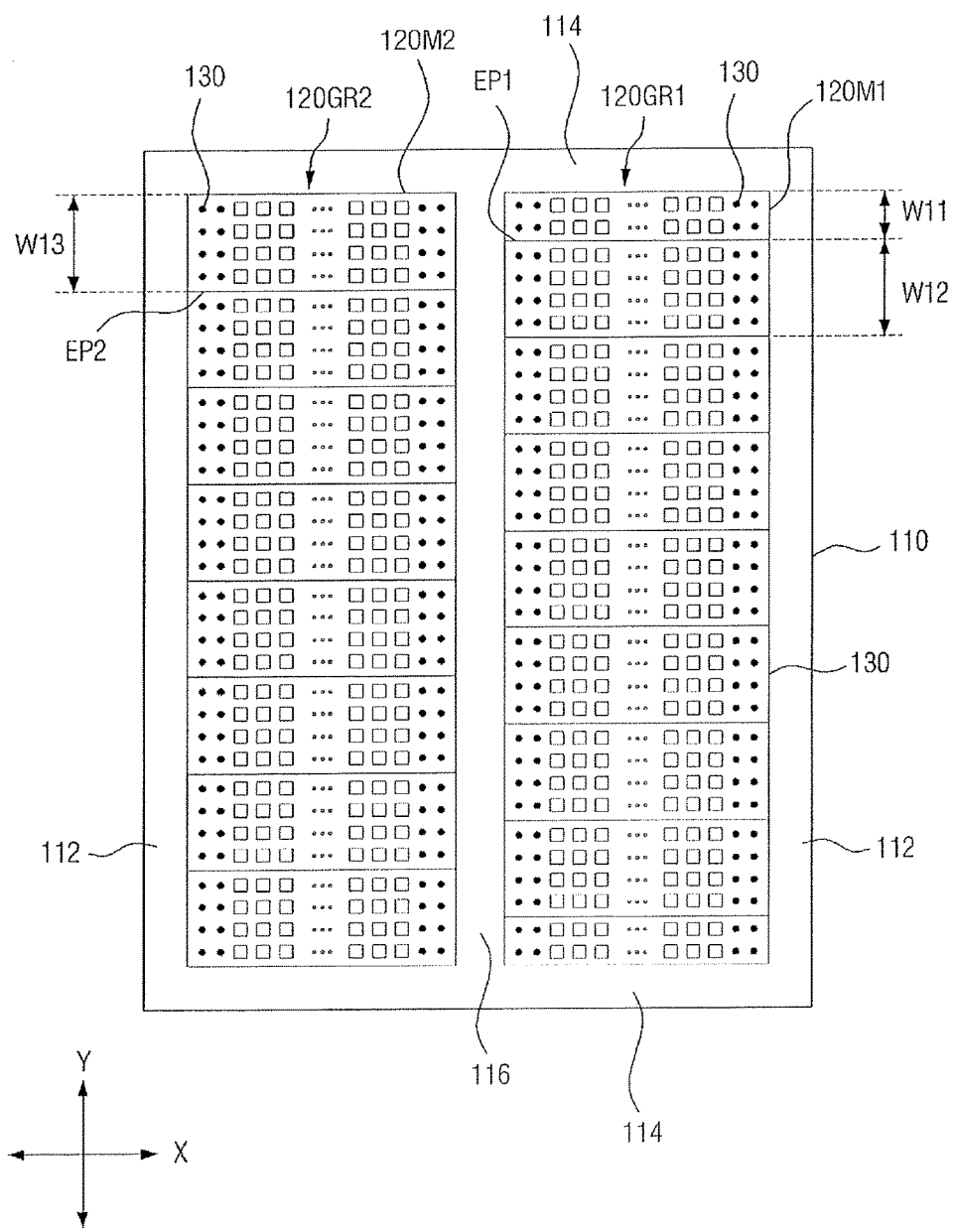
FIG. 3 illustrates a plan view of the deposition mask assembly of FIG. 1.

Hereinafter, the arrangement of the first split mask group 120GR1 and the second split mask group 120GR2 on the frame 110 will be described with reference to FIG. 3. FIG. 3 is a plan view of the deposition mask assembly 100.

Referring to FIG. 3, the boundary EP1 between adjacent first split masks 120M1 in the second direction (Y) and the boundary EP2 between adjacent second split masks 120M2 in the second direction (Y) are located at different positions in the second direction (Y). For example, as illustrated in FIG. 3, boundaries EP1 and EP2 are offset, e.g., misaligned, with respect to each other along the second direction (Y), e.g., so an imaginary extension of the boundary EP2 may be between two adjacent boundaries EP1 along the second direction (Y).

In this case, when a substrate (500 of FIG. 5) sequentially moves over the first split mask group 120GR1 and the second split mask group 120GR2 in the first direction (X) in order to deposit a deposition material onto the substrate (500 of FIG. 5), the amount of the deposition material deposited on different portions of the substrate are substantially the same. For example, the deposition material deposited onto a first portion of the substrate, i.e., a portion passing through the upper portion of the boundary EP1 between the adjacent first split masks 120M1 and the upper portion of the second split masks 120M2 in the first direction (X), a second portion of the substrate, i.e., a portion passing through the upper portion of the first split masks 120M1 and the upper portion of the second split masks 120M2 in the first direction (X), and a third portion of the substrate, i.e., a portion passing through the upper portion of the first split masks 120M1 and the upper portion of the boundary EP2 between the adjacent second split masks 120M2 in the first direction (X), may not be significantly different from one another.

The reason for this is that the amount of the deposition material deposited on a portion of the substrate passing through the boundary EP1 is corrected by passing through the second split masks 120M2, and the amount of the deposition material deposited on a portion of the substrate passing through the boundary EP2 is corrected by passing through the first split masks 120M1. That is, according to embodiments, since the substrate does not have a portion passing through both the upper portion of the boundary EP1 and the upper portion of the boundary EP2, the difference in the thickness of the deposition material between pixels of the substrate is not large. Therefore, in the light-emitting display device including a thin film, e.g., a light-emitting layer, formed by deposition, the non-uniformity of luminance efficiency due to the large difference in the thickness of the thin film between the pixels of the substrate can be reduced, so as to improve the display quality of the light-emitting display device.

Figure 5:
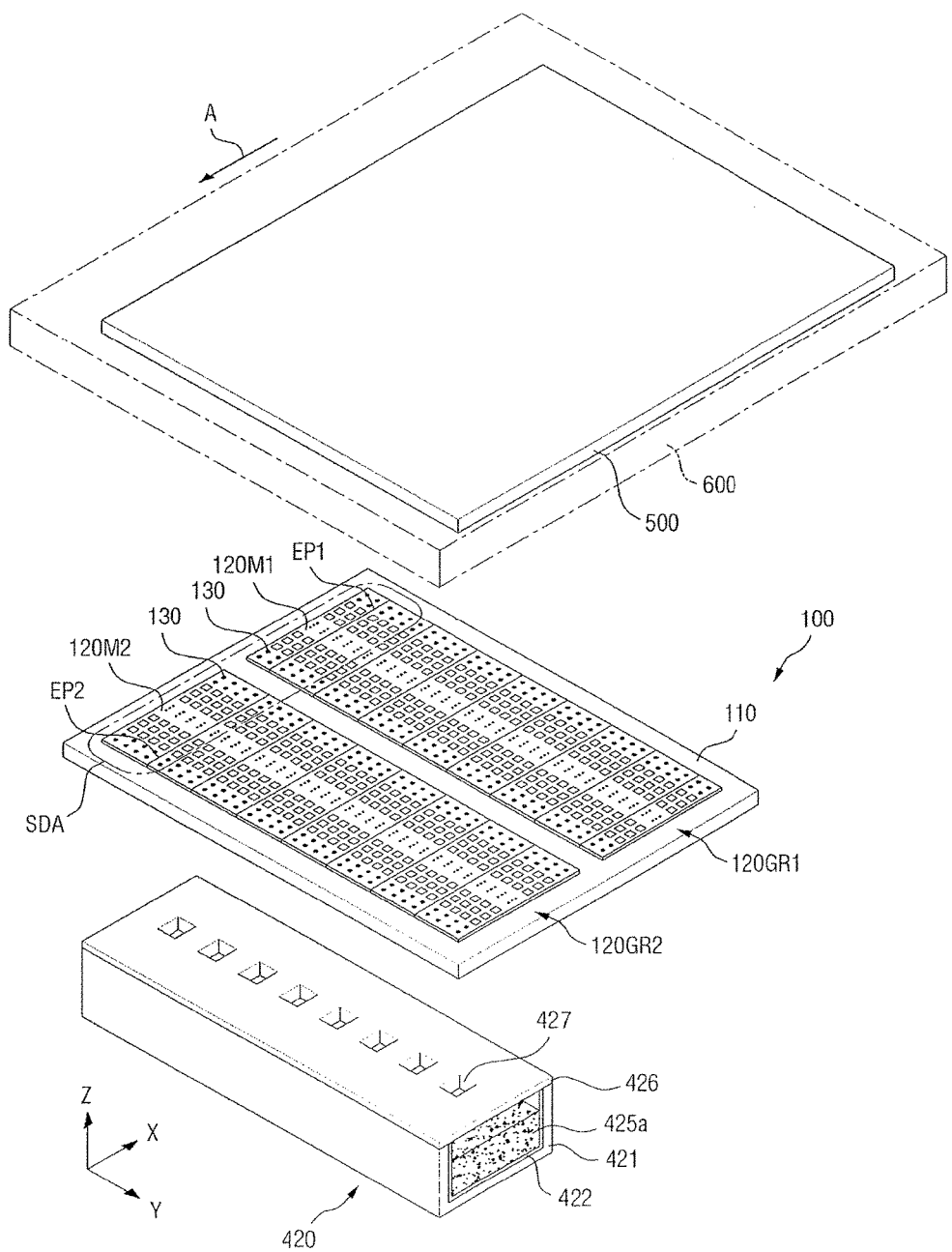

In detail, at the time of attaching the first split masks 120M1 and the second split masks 120M2 onto the frame 110 by welding in a state where tensile force is applied, if the first split masks 120M1 and the second split masks 120M2 on the frame 110 are not precisely aligned by tensile force or welding, the boundary EP1 and the boundary EP2 may cause the deposition material to be slightly or excessively deposited on the substrate (500 of FIG. 5). Therefore, since the boundaries EP1 and EP2 according to embodiments are misaligned with each other, the amount of the deposition material deposited on a portion of the substrate passing over either of the boundaries EP1 and EP2 is corrected by passing through a non-boundary region of corresponding second or first split masks. In contrast, if the substrate were to have a portion passing through both the upper portion of the boundary EP1 between the adjacent first split masks 120M1 and the upper portion of the boundary EP2 between the adjacent second split masks 120M2 in the first direction (X), a thickness difference between a thin film formed by depositing the deposition material on a portion passing through both boundaries EP1 and EP2, and a thin film formed by depositing the deposition material on a portion not passing through any boundaries may increase.

The outermost edges of the first split masks 120M1 disposed at the outermost sides of the first split mask group 120GR1 and the outermost edges of the second split masks 120M2 disposed at the outermost sides of the second split mask group 120GR2 may be located at the same positions in the second direction (Y). Further, the first split mask 120M1 disposed at the outermost side of the first split mask group 120GR1 and the second split mask 120M2 disposed at the outermost side of the second split mask group 120GR2 have different widths from each other in the second direction (Y) and face each other in the first direction (X). For example, as shown in FIG. 3, each of the first split masks 120M1 disposed at the outermost sides of the first split mask group 120GR1 has a first width W11 in the second direction (Y), each of the first split masks 120M1, other than the first split masks 120M1 disposed at the outermost sides of the first split mask group 120GR1, has a second width W12 larger than the first width W11 in the second direction (Y), and each of the second split masks 120M2 of the second split mask group 120GR2 has a third width W13 larger than the first width W11 in the second direction (Y). The third width W13 may be equal to the second width W12.

As described above, since the deposition mask assembly 100 according to an embodiment of the present disclosure includes the first split mask group 120GR1 and the second split mask group 120GR2, which are configured such that the boundary EP1 between the adjacent first split masks 120M1 in the second direction (Y) and the boundary EP2 between the adjacent second split masks 120M2 in the second direction (Y) are located at different positions in the second direction (Y), a difference of thicknesses of the overall amounts of deposition material deposited around boundary regions may be minimized. That is, the first thickness of the deposited material when the substrate passes through the upper portion of the boundary EP1 between the adjacent first split masks 120M1, which can allow the deposition material to be slightly or excessively deposited on the substrate (500 of FIG. 5), followed by passing through the upper portion of the second split masks 120M2 in the first direction (X), and the second thickness of the deposited material when the substrate passes through the upper portion of the first split masks 120M1, followed by passing through the upper portion of the boundary EP2 between the adjacent second split masks 120M2, which can allow the deposition material to be slightly or excessively deposited on the substrate (500 of FIG. 5), may be substantially similar to each other.

Therefore, since a thickness difference in the deposition material among pixels of the substrate (500 of FIG. 5), in the light-emitting display device including a thin film (for example, light-emitting layer) formed by deposition is minimized, the non-uniformity of luminance efficiency due to the large difference in the thickness of the thin film among the pixels of the substrate may be reduced. Therefore, display quality of the light-emitting display device may be improved.

Hereinafter, a method of manufacturing a display device using the deposition mask assembly of FIGS. 1 to 3 will be described with reference to FIGS. 4-11. FIGS. 4 to 11 are views for explaining the method of manufacturing a display device using the deposition mask assembly of FIG. 1.

As the method of manufacturing a display device, a method of manufacturing a light-emitting display device will be described. In the method of manufacturing a light-emitting display device, a process of forming common layers, e.g., a hole injection layer 30 and a light-emitting layer 50, will be described.

Figure 4:
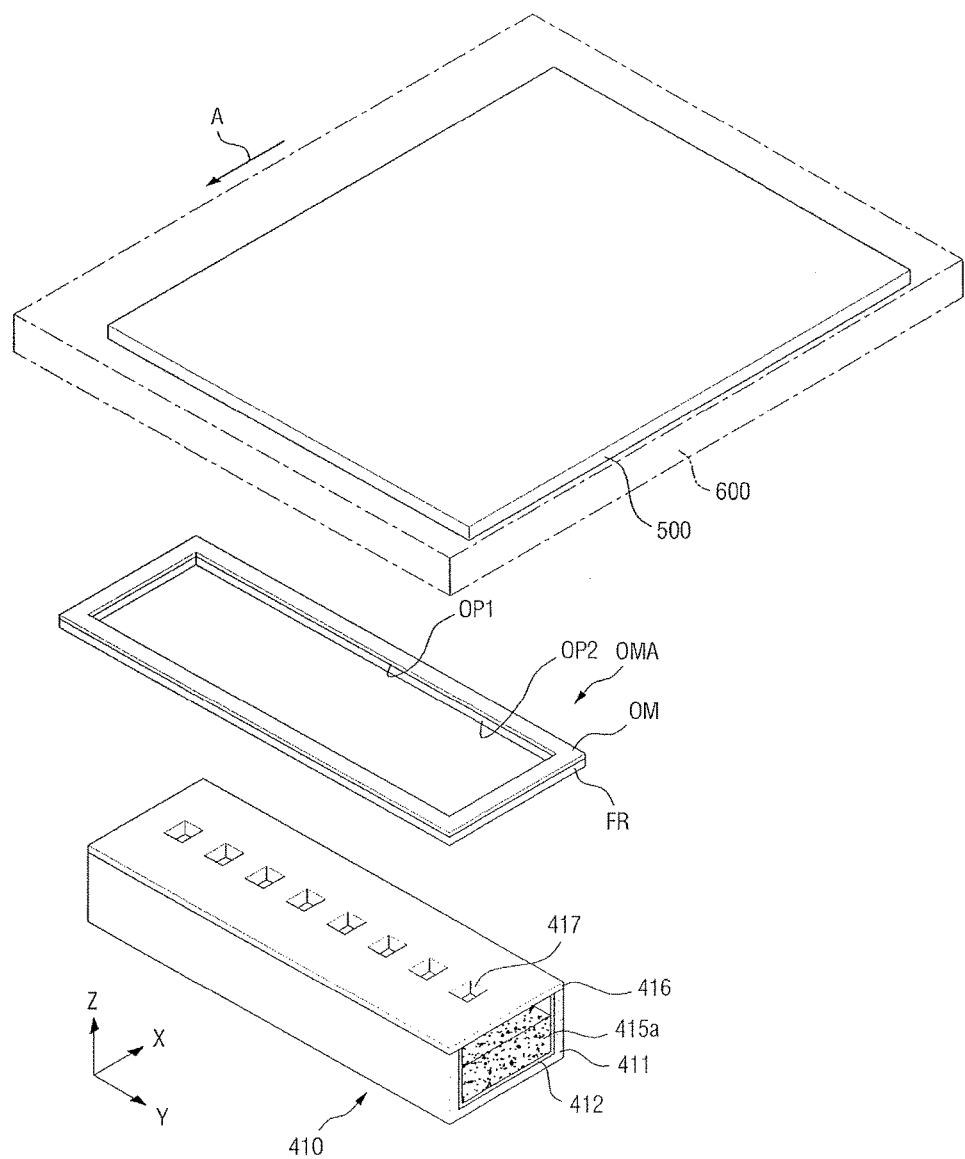
FIGS. 4 to 11 illustrate views for explaining a method of manufacturing a display device using the deposition mask assembly of FIG. 1.

First, referring to FIG. 4, a substrate 500 supported by a carrier 600 moves over an open mask assembly (OMA) disposed on a deposition source 410 in the first direction (X). A deposition material evaporates and is discharged from the deposition source 410 to be deposited on the substrate 500. In FIG. 4, "A" represents a moving direction of the substrate 500.

Figure 6:
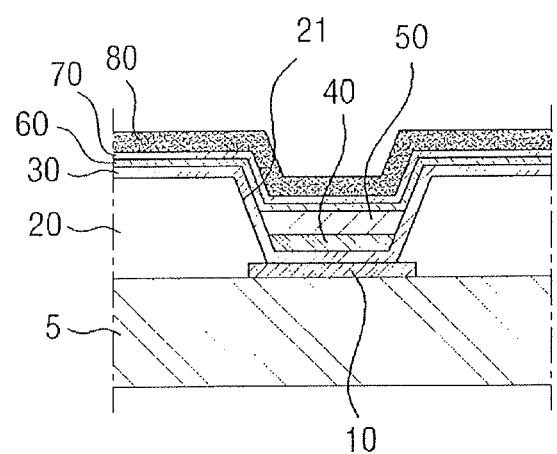

As shown in FIG. 6, the hole injection layer 30 is formed over the entire surface of a pixel defining film 20 formed on a unit substrate 5 including a first electrode 10 (formed for each pixel) and a pixel opening 21 exposing the first electrode 10 (regardless of the pixel). Meanwhile, in FIG. 4, the substrate 500 may be a mother substrate including a plurality of unit substrates (5 of FIG. 6). In FIG. 6, the unit substrate 5 may be a substrate of one light-emitting display device.

Referring back to FIG. 4, the open mask assembly OMA may include an open mask OM and an open frame FR. The open mask OM may be formed in the shape of a rectangular ring defining a mask opening OP1. The open frame FR supports the open mask OM, and may be formed in the shape of a rectangular ring defining a frame opening OP2 such that the open frame FR corresponds to the open mask OM. The open mask assembly OMA is spaced apart from the substrate 500 by a predetermined distance when the substrate 500 moves in the first direction (X). The open mask assembly OMA including the open mask OM and the open frame FR can prevent a deposition material from leaking to unnecessary regions.

The deposition source 410 is disposed to be fixed beneath the open mask assembly OMA, and discharges a deposition material 415a toward the substrate moving in the first direction X while maintaining a spaced distance from the open mask assembly OMA. Thus, a non-patterned common layer is formed over the entire substrate 500. For example, when the substrate is a light-emitting display device, a hole injection layer (30 of FIG. 6) may be formed over the entire surface of a pixel defining film (20 of FIG. 6) formed on the substrate 500.

In detail, the deposition source 410 may include a crucible 412 filled with the deposition material 415a, a heater 411 surrounding the crucible 412 and heating the crucible 412 to vaporize the deposition material 415a, and a nozzle unit 416 disposed on the crucible 412 to allow nozzles 417 to face toward the substrate 500. The length of the deposition source 410 in the second direction (Y) may be similar to the length of the open mask assembly OMA.

Subsequently, referring to FIG. 5, the deposition mask assembly 100 of FIG. 1 is disposed on a deposition source 420. The deposition source 420 is disposed to be fixed beneath the deposition mask assembly 100, and discharges a deposition material 425a toward the substrate 500 moving in the first direction (X) while maintaining a spaced distance from the deposition mask assembly 100. In FIG. 5, "A" represents a moving direction of the substrate 500.

In detail, the deposition source 420 may include a crucible 422 filled with the deposition material 425a, a heater 421 surrounding the crucible 422 and heating the crucible 422 to vaporize the deposition material 425a, and a nozzle unit 426 disposed on the crucible 422 to allow nozzles 427 to face toward the substrate 500. The length of the deposition source 420 in the second direction (Y) may be similar to the length of the deposition mask assembly 100.

Then, the substrate 500 supported by the carrier 600 moves over the deposition mask assembly 100 having a shorter length than the substrate in the first direction (X), and the deposition material evaporated on the substrate passing through the first split mask group 120M1 and the second split mask group 120M2 is discharged by using the deposition source 420. In this case, as shown in FIG. 6, the light-emitting layer 50 is formed on a hole transport layer 40 in the pixel opening 21 of the pixel defining film 20, and the hole injection layer 30 is formed on a substrate 5. For example, the light-emitting layer 50 shown in FIG. 6 may be a red light-emitting layer disposed at a red pixel.

Figure 7:
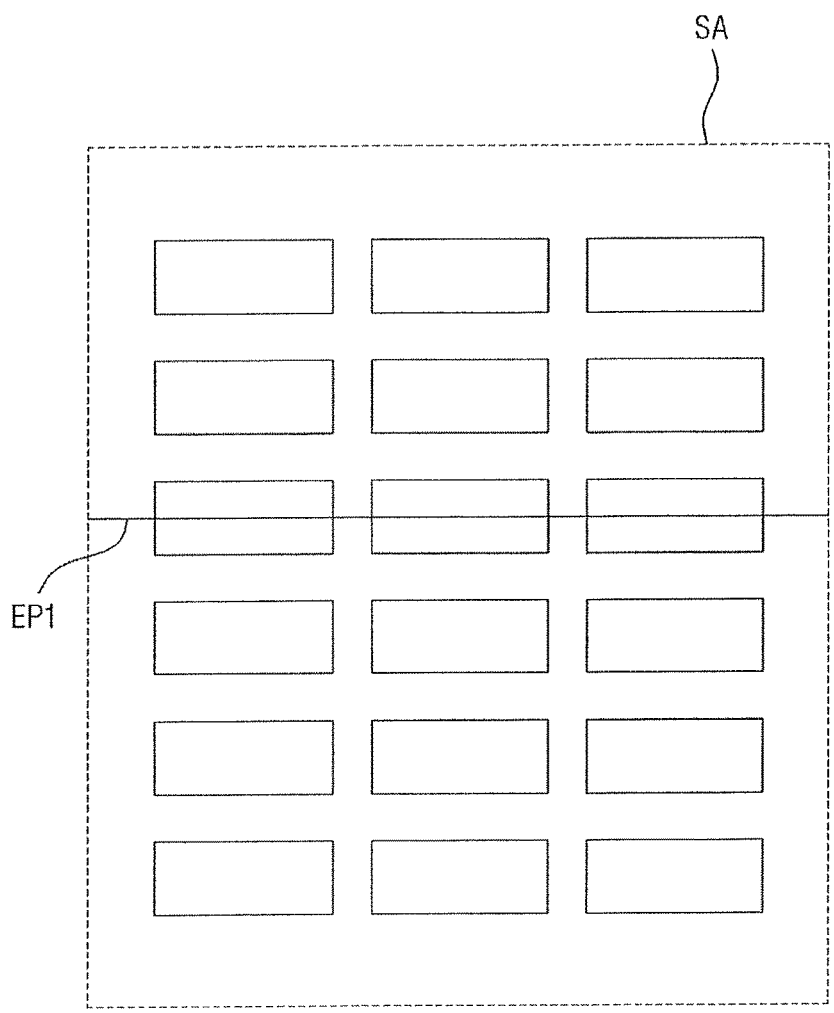
Figure 8:
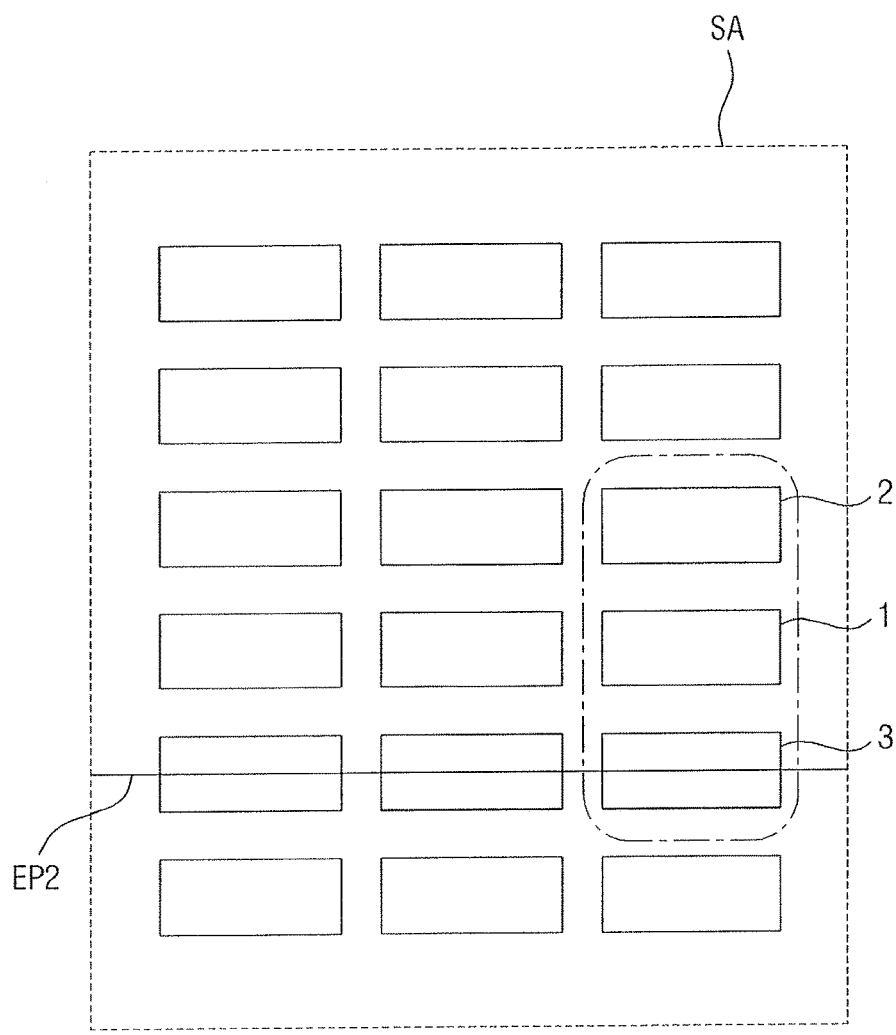
Figure 9:
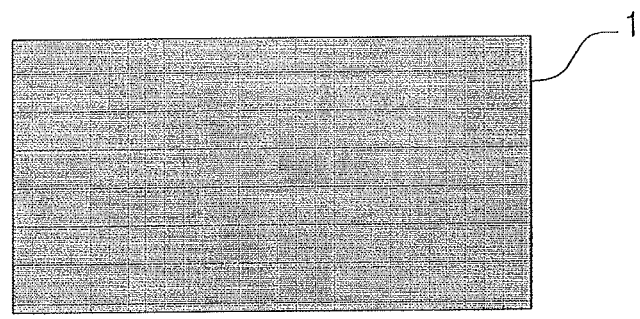

Meanwhile, when the substrate 500 supported by the carrier 600 passes through the first split mask group 120GR1 and the second split mask group 120GR2 as shown in FIG. 5, one area SA of the substrate (500 of FIG. 5) passing through the boundary EP1 of the first split masks 120M1 as shown in FIG. 7 and one area SA of the substrate (500 of FIG. 5) passing through the boundary EP2 of the second split masks 120M2 as shown in FIG. 8 may be located at different positions. In this case, when a substrate (500 of FIG. 5) sequentially moves over the first split mask group 120GR1 and the second split mask group 120GR2 in the first direction (X) in order to deposit a deposition material onto the substrate (500 of FIG. 5), the amount of the deposition material deposited on a pixel (1 of FIGS. 8 and 9) of a portion of the substrate passing through the upper portion of the first split masks 120M1 and the upper portion of the second split masks 120M2 in the first direction (X), the amount of the deposition material deposited on a pixel (2 of FIGS. 8 and 10) of a portion of the substrate passing through the upper portion of the boundary EP1 of the first split masks 120M1 and the upper portion of the boundary EP2 of the second split masks 120M2 in the first direction (X), and the amount of the deposition material deposited on a pixel (3 of FIGS. 8 and 11) of a portion of the substrate passing through the upper portion of the boundary EP1 of the first split masks 120M1 and the upper portion of the boundary EP2 of the second split masks 120M2 in the first direction (X), may not be significantly different from one another.

Figure 10:
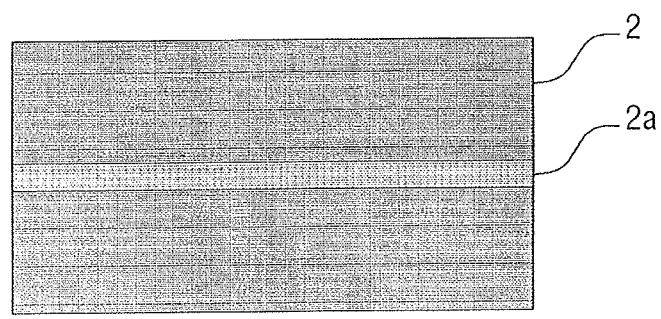

For example, in FIG. 10, a central portion 2a of a pixel 2 is a portion substantially passing through the boundary EP1 of the first split masks 120M1 in the substrate (500 of FIG. 5). The amount of the deposition material deposited on the central portion 2a of the pixel 2 is not greatly different from the amount of the deposition material deposited on other portions of the pixel 2, i.e., portions not passing through the boundary EP1 of the first split masks 120M1.

Figure 11:
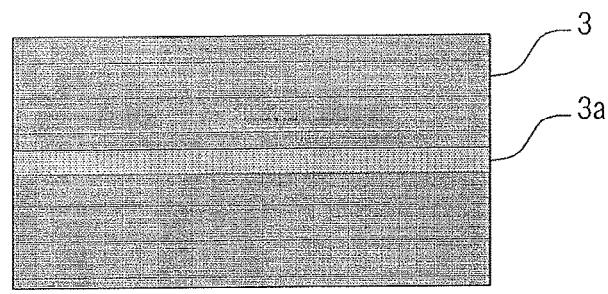

Similarly, in FIG. 11, a central portion 3a of a pixel 3 is a portion substantially passing through the boundary EP2 of the second split masks 120M2 in the substrate (500 of FIG. 5). The amount of the deposition material deposited on the central portion 3a of the pixel 3 is not greatly different from the amount of the deposition material deposited on other portions of the pixel 3, i.e., portions not passing through the boundary EP2 of the second split masks 120M2.

Accordingly, at the time of discharging the deposition material toward the substrate 500 moving in the first direction (X) through the deposition source 420, the deposition mask assembly 100 allows a pattern layer, e.g., the light-emitting layer 50, having a uniform thickness in the light-emitting display to be formed on a specific portion of the substrate 500.

Meanwhile, although not shown, before formation of the light-emitting layer 50, the hole transport layer 40 is formed in a same manner as the light-emitting layer 50. Although the light-emitting layer has been described as a red light-emitting layer above, the light-emitting layer may be a green light-emitting layer disposed on a green pixel or a blue light-emitting layer disposed on a blue pixel. Further, after formation of the light-emitting layer 50, an electron transport layer 60, an electron injection layer 70, and a second electrode 80 may be formed in the same manner as the light-emitting layer 50.

Figure 12:
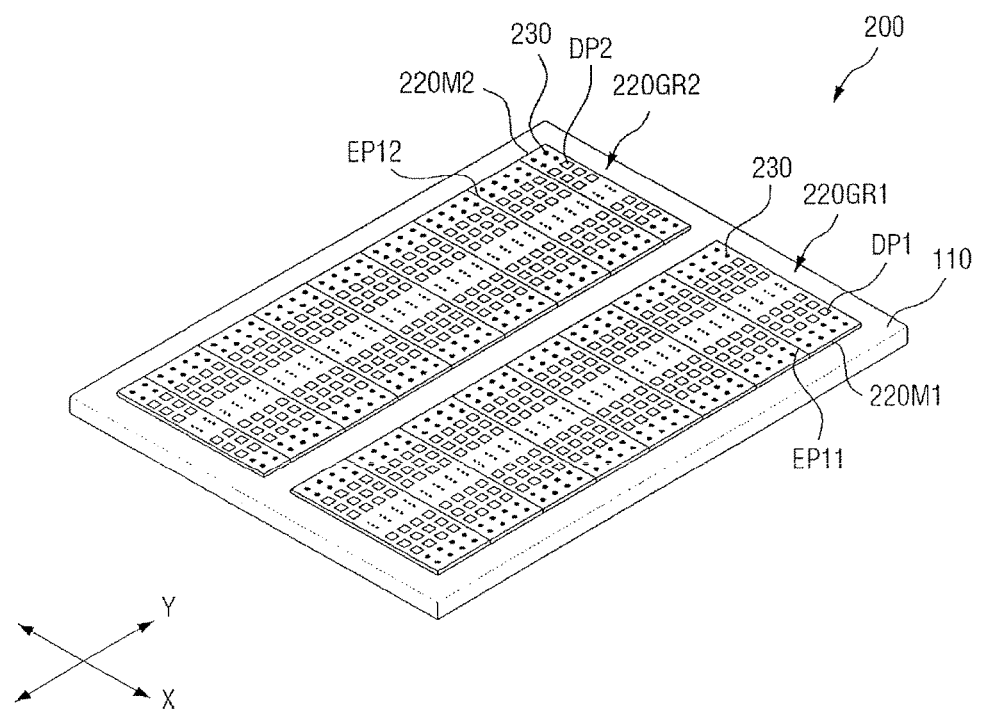
FIG. 12 illustrates a perspective view of a deposition mask assembly according to another embodiment of the present disclosure.

FIG. 12 is a perspective view of a deposition mask assembly according to another embodiment.

Referring to FIG. 12, a deposition mask assembly 200 according to another embodiment of the present disclosure has the same configuration as the deposition mask assembly 100 of FIGS. 1 to 3, except for the first split mask group 220GR1 and the second split mask group 220GR2. Therefore, in the deposition mask assembly 200 according to another embodiment of the present disclosure, the first split mask group 220GR1 and the second split mask group 220GR2 will be mainly described, and duplicate descriptions will be omitted.

The deposition mask assembly 200 according to another embodiment of the present disclosure may include the frame 110, a first split mask group 220GR1, and a second split mask group 220GR2.

The first split mask group 220GR1 includes a plurality of first split masks 220M1 arranged on the opening portion (110a of FIG. 2) of the frame 110 in the second direction (Y). Each of the first split masks 220M1 includes deposition openings DP1 and welded portions 230 formed at both edges thereof in the first direction (X).

The second split mask group 220GR2 includes a plurality of second split masks 220M2 arranged on the opening portion (110b of FIG. 2) of the frame 110 in the second direction (Y). Each of the second split masks 220M2 includes deposition openings DP2 and welded portions 230 formed at both edges thereof in the first direction (X).

The first split mask group 220GR1 and the second split mask group 220GR2 are similar to the first split mask group 220GR1 and the second split mask group 220GR2 of FIGS. 1 to 3, except that split masks having different widths from each other are arranged in the second split mask group 220GR2. That is, each of the second split masks 220M2 disposed at the outermost sides of the second split mask group 220GR2 has a first width W11 (W11 of FIG. 3) in the second direction (Y), each of the second split masks 220M2, other than the second split masks 220M2 disposed at the outermost sides of the second split mask group 220GR2, has a second width W12 (W12 of FIG. 3) larger than the first width W11 (W11 of FIG. 3) in the second direction (Y), and each of the first split masks 220M1 of the first split mask group 220GR1 has a third width W13 (W13 of FIG. 3) larger than the first width W11 in the second direction (Y). The third width W13 may be equal to the second width W12. The deposition mask assembly 200 including the first split mask group 220GR1 and the second split mask group 220GR2 exhibits the same effects as the deposition mask assembly 100 of FIGS. 1 to 3.

Figure 13:
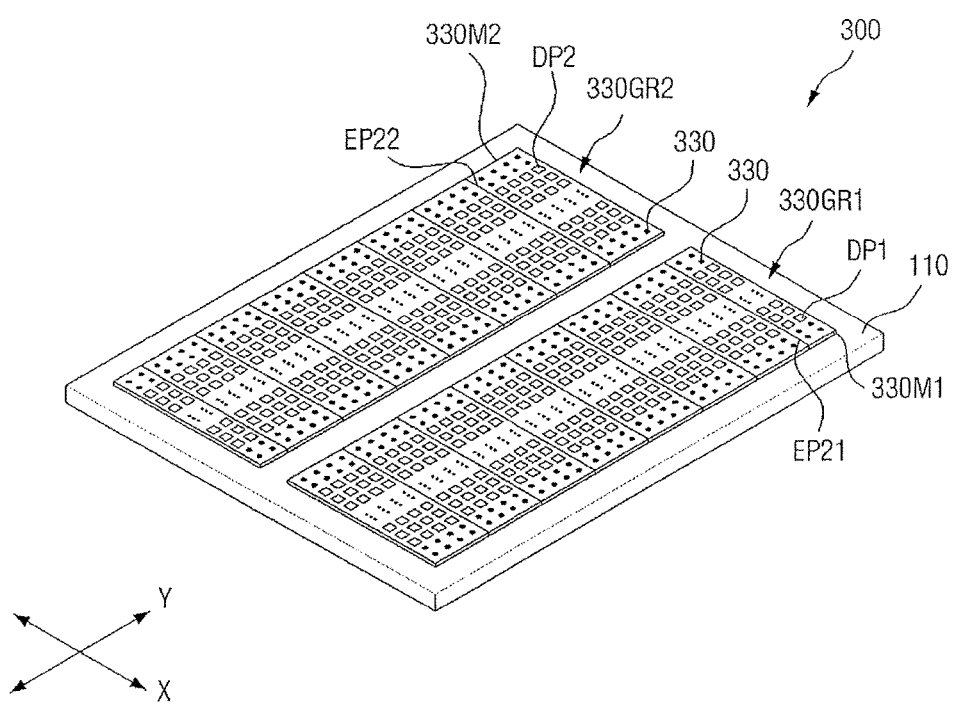
FIG. 13 illustrates a perspective view of a deposition mask assembly according to still another embodiment of the present disclosure.

FIG. 13 is a perspective view of a deposition mask assembly according to still another embodiment of the present disclosure.

Referring to FIG. 13, the deposition mask assembly 300 has the same configuration as the deposition mask assembly 100 of FIGS. 1 to 3, except for the first split mask group 320GR1 and the second split mask group 320GR2. Therefore, in the deposition mask assembly 300, the first split mask group 320GR1 and the second split mask group 320GR2 will be mainly described, and duplicate descriptions will be omitted.

The deposition mask assembly 300 may include the frame 110, a first split mask group 320GR1, and a second split mask group 320GR2.

The first split mask group 320GR1 includes a plurality of first split masks 320M1 arranged on the opening portion (110a of FIG. 2) of the frame 110 in the second direction (Y). Each of the first split masks 320M1 includes deposition openings DP1 and welded portions 330 formed at both edges thereof in the first direction (X).

The second split mask group 320GR2 includes a plurality of second split masks 320M2 arranged on the opening portion (110b of FIG. 2) of the frame 110 in the second direction (Y). Each of the second split masks 320M2 includes deposition openings DP2 and welded portions 330 formed at both edges thereof in the first direction (X).

The first split mask group 320GR1 and the second split mask group 320GR2 are similar to the first split mask group 120GR1 and the second split mask group 120GR2 of FIGS. 1 to 3, except that split masks having different widths from each other are arranged in both the first split mask group 320GR1 and the second split mask group 320GR2. That is, the first split mask 320M1 located at one side of the first split masks 320M1 disposed at the outermost sides of the first split mask group 320GR1 and the second split mask 320M2 located at the other side of the second split masks 320M2 disposed at the outermost sides of the second split mask group 320GR2 has a first width W11 (W11 of FIG. 3) in the second direction (Y). Further, each of the first split masks 320M1, other than the first split mask 320M1 located at one side of the first split masks 320M1 disposed at the outermost sides of the first split mask group 320GR1, has a second width W12 (W12 of FIG. 3) larger than the first width W11 (W11 of FIG. 3) in the second direction (Y), and each of the second split masks 320M2, other than the second split mask 320M2 located at the other side of the second split masks 320M2 disposed at the outermost sides of the second split mask group 320GR2, also has a second width W12 (W12 of FIG. 3) larger than the first width W11 (W11 of FIG. 3) in the second direction (Y).

The deposition mask assembly 300 including the first split mask group 320GR1 and the second split mask group 320GR2 exhibits the same effects as the deposition mask assembly 100 of FIGS. 1 to 3.

By way of summation and review, when a deposition process of a large substrate is performed by the SMS deposition method, a small mask having a smaller size than the large substrate is used. However, the size of the small substrate itself used in the deposition process of the large substrate is not significantly small. Therefore, the warpage of the small mask due to its own weight may occur, and it may be difficult to maintain the constant spaced distance between the small mask and the large substrate. The non-uniform spaced distance between the small mask and the large substrate may cause a distortion to the pattern of a thin film formed by depositing a deposition material on the substrate. In contrast, According to the deposition mask assembly of an embodiment, distortion of patterns of a thin film can be reduced at the time of forming a thin film on a large substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a display device, the method comprising:
    disposing a deposition mask assembly on a deposition source, the deposition mask assembly including:
        a frame including a first opening portion and a second opening portion spaced apart from each other in a first direction,
        a first split mask group including a plurality of first split masks arranged on the first opening portion in a second direction crossing the first direction, and
        a second split mask group including a plurality of second split masks arranged on the second opening portion in the second direction,
        wherein a boundary between adjacent first split masks in the second direction and a boundary between adjacent second split masks in the second direction are at different positions; and
    moving a substrate over the deposition mask assembly in the first direction, while discharging a deposition material toward the substrate, such that the substrate sequentially passes through the first split mask group and the second split mask group using the deposition source to form a pattern layer on a portion of the substrate, the portion of the substrate passing through the first split mask group and the second split mask group.

2. The method as claimed in claim 1, wherein forming the pattern layer includes forming at least one of a hole transport layer and a light-emitting layer in a light-emitting display device.

3. The method as claimed in claim 1, wherein disposing the deposition mask assembly includes disposing the deposition mask assembly to be spaced apart from the substrate.

4. The method as claimed in claim 1, wherein moving the substrate over the deposition mask assembly includes using a deposition mask assembly having a shorter length than the substrate in the first direction.

5. The method as claimed in claim 1, wherein disposing the deposition mask assembly includes having outermost edges of the first split masks at outermost sides of the first split mask group and outermost edges of the second split masks at outermost sides of the second split mask group at same positions in the second direction.

6. The method as claimed in claim 1, wherein disposing the deposition mask assembly includes arranging a first split mask of the plurality of first split masks at an outermost side of the first split mask group and a second split mask of the plurality of second split masks at an outermost side of the second split mask group to have different widths from each other in the second direction, and face each other in the first direction.

7. The method as claimed in claim 6, wherein each of the first split masks at outermost sides of the first split mask group has a first width in the second direction, each of the first split masks, other than the first split masks at the outermost sides of the first split mask group, has a second width larger than the first width in the second direction, and each of the second split masks of the second split mask group has a third width equal to the second width.

8. The method as claimed in claim 6, wherein each of the second split masks at outermost sides of the second split mask group has a first width in the second direction, each of the second split masks, other than the second split masks at the outermost sides of the second split mask group, has a second width larger than the first width in the second direction, and each of the first split masks of the first split mask group has a third width equal to the second width.

9. The method as claimed in claim 6, wherein:
    the first split mask at the outermost side of the first split mask group and a second split mask at an opposite outermost side of the second split mask group have a first width in the second direction,
    each of the plurality of first split masks, other than the first split mask at the outermost side of the first split mask group, has a second width larger than the first width in the second direction, and
    each of the plurality of the second split masks, other than the second split mask at the opposite outermost side of the second split mask group, has the second width in the second direction.

10. The method as claimed in claim 1, wherein:
    each of the first split masks includes welded portions at opposite edges thereof in the first direction,
    each of the second split masks includes welded portions at opposite edges thereof in the first direction, and
    welded portions of the first split mask and welded portion of the second split mask, which face each other, partially overlap each other in the first direction.

11. The method as claimed in claim 10, wherein:
    the frame includes a reinforcing support defining the first opening portion and the second opening portion, the reinforcing support extending in the second direction, and
    the welded portions of the first split masks and the welded portions of the second split masks face each other on the reinforcing support.

* * * * *